INVENTORS.
WOLFGANG W. GAERTNER &
RAYMOND F. HECK
BY
Brumbaugh, Free, Graves & Donohue
their ATTORNEYS INVENTORS.
WOLFGANG W. GAERTNER &
RAYMOND F. HECK
BY
Brumbaugh, Free, Graves & Donohue
their ATTORNEYS United States Patent Office 3,237,061
Patented Feb. 22, 1966

3,237,061

SEMICONDUCTOR DEVICE HAVING EXPOSED SEMICONDUCTOR SURFACE AND METHOD OF MANUFACTURE

Wolfgang W. Gaertner, Stamford, and Raymond F. Heck, Wilton, Conn., assignors to Columbia Broadcasting System, Inc., New York, N.Y., a corporation of New York Filed July 26, 1961, Ser. No. 126,924
5 Claims. (Cl. 317—234)

Figure 1:
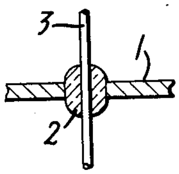

The present invention relates to semiconductor devices and their methods of fabrication, and more particularly to semiconductor devices incorporating a hermetic seal formed between the semiconductor material and a vitreous material, such as glass.

In conventional semiconductor device fabrication, the semiconductor structure is mounted on a header, usually formed of metal, and hermetically enclosed within a metal can to seal out dust, dirt, moisture, etc. The small size of the finally assembled device requires extremely accurate tolerances and delicate manufacturing techniques for its production. As a result, a relatively large proportion of the devices produced are discarded or reworked because of faulty seals, which subject the enclosed semiconductor material to ambient atmospheric conditions and thus deteriorate its operating characteristics.

Moreover, even though conventional diodes and transistors are relatively small, as compared to the vacuum tube for example, the present day trend toward increased miniaturization of electronic circuitry has rendered even these devices bulky and unwieldy. Printed circuit techniques and circuit components fabricated in the form of thin films deposited on insulated supporting surfaces have enabled entire circuit complexes to be made as small as the transistor device itself. Obviously, the conventional header-can construction of the transistor cannot be simply reduced in size to accommodate this miniature circuitry because of the limitations inherent in the manufacturing process.

Accordingly, it is the primary object of the present invention to provide improved semiconductor devices having greater reliability and smaller size than devices heretofore known.

It is a further object of this invention to provide novel methods of semiconductor device fabrication characterized by simplicity and uniformly high quality of product.

A still further object of this invention is to provide novel semiconductor devices requiring no separate mounting means and wherein the semiconductor material itself form a part of the exterior surface of the device.

Yet another object of this invention is to provide semiconductor devices utilizing vitreous materials bonded to the semiconductor to enable substantial reduction in size of the resultant device and improvement in life and stability of operation.

The above and other objects, features, and advantages of the present invention will become more apparent from the following detailed description thereof when taken in conjunction with the appended drawings, in which:

FIGURES 1, 2*a*, 2*b*, 2*c*, 3*a*, 3*b*, 3*c*, 4*a*, 4*b*, 5, 6, 7 and 8 illustrate in cross-section various semiconductor devices fabricated in accordance with the present invention. A more detailed discussion of the figures is found on the following pages.

It has been found that the properties of the semi-conductor materials, e.g., silicon, germanium, and the properties of many common glasses or other vitreous materials are such that an extremely strong bond between them may be formed under the proper conditions. Many of the common glasses have softening or working temperatures in the range of 500° to 800° C., considerably below the melting point of silicon (1420° C.) and germanium (940° C.). This permits heating of the semiconductor material to a temperature at which a glass would soften, without significantly altering the shape of the semiconductor material or its electrical properties. Upon heating, the semiconductor material forms an oxide which will diffuse into a softened glass placed in contact with it. When the materials are cooled, a strong fused bond is formed, providing an excellent hermetic seal between them.

Since many of the common glasses have coefficients of expansion in the same range as those of the semiconductor materials, residual strains are reduced to a minimum. As an example, silicon has a coefficient of expansion over normal temperatures which ranges from $3.7\times10^{-6}/°$ C. to $4.2\times10^{-6}/°$ C. A glass made by Corning Glass Company, and identified by Code Number 3320, has a coefficient of expansion (over the same temperature range) of $4.0\times10^{-6}/°$ C., which is in the middle of the range of coefficients of the semiconductor material. The close match of the expansion coefficients of this glass, and other, with the semiconductor material has resulted in seals showing substantially no residual strains in the glass. Other common glasses have expansion coefficients in the range of germanium ($6.1\times10^{-6}/°$ C.). The excellent electrical and thermal insulating qualities of glass may therefore be wedded directly to semiconductor materials to form an extremely rugged semiconductor structure.

Furthermore, glass is readily workable even in very small pieces, and a P–N junction, for example, may be entirely sealed and enclosed by a drop or cup of glass covering an area just slightly larger than that of the junction itself. The active area of the semiconductor material being hermetically sealed, no external can or enclosure is needed and the overall size of the semiconductor device is considerably reduced. In the preferred forms of devices made in accordance with this technique, the semiconductor material itself forms a portion of the exterior surface of the complete device.

Referring now to the drawings, there is illustrated in FIGURE 1 a conductor-feed-through arrangement utilizing the semiconductor-glass seal of the present invention. A wafer 1 of semiconductor material is provided with an aperture in which is placed a bead of glass 2. The elements are heated to a temperature at which the glass softens and forms the bond with the semiconductor material, as described hereinabove. While the glass bead 2 is in its softened state, a conductive lead wire 3 may be pushed through it, or alternatively, the bead may be fused to the lead prior to insertion in the semiconductor wafer. The lead 3 may be made of a material such as Kovar metal which, as is well known, will form a hermetic seal with the glass. When the entire structure is cooled, fused bonds are present between the semiconductor material and the glass bead, and between the glass bead and the conductive lead, the latter at the same time being electrically and thermally insulated from the wafer 1.

Figure 2A:
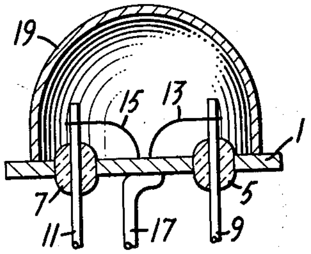

The feed through arrangement shown in FIGURE 1 may be used to fabricate the transistor device shown in FIGURE 2*a*. The device includes a semiconductive wafer 1 having a pair of apertures in which are placed glass beads 5 and 7. Lead wires 9 and 11 extend through the glass beads 5 and 7 respectively, in the manner described in connection with FIGURE 1. From the upper ends of the respective leads extend wires 13 and 15, which form conventional point contacts with the upper surface of the semiconductive wafer 1. A lead 17 is ohmically connected to the lower surface of the wafer. Finally, the active electrode structure of the device, comprising the point contacts formed by wires 13 and 15, are enclosed within a cup-shaped cap member 19, which may be of metal or glass, hermetically sealed to the wafer. By virtue of the glass-to-semiconductor seal effected between the beads 5 and 7 and the wafer 1, no separate header is required for mounting the electrode structure of the device, and the lower surface of the wafer 1 actually forms a portion of the exterior surface of the finished device.

Figure 2B:
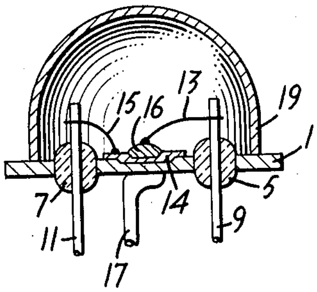

An adaptation of the structure of FIGURE 2*a* for use with a junction transistor device is shown in FIGURE 2*b*. Instead of forming point contacts with the semiconductive material 1, the leads 13 and 15 are electrically connected to the zones 14 and 16, respectively, of a suitably doped semiconductor material, which together with the wafer 1, forms a junction transistor. The transistor device itself may be of either the N–P–N or P–N–P variety of any well known construction, and the wafer 1 may form either the emitter or collector electrode thereof. Although illustrated in connection with a three electrode-transistor device, it will be apparent that the arrangement of FIGURES 2*a* and 2*b* may be adapted as well to diodes or to other multi-electrode devices.

Figure 2C:
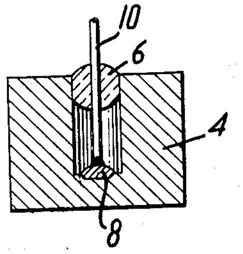

The diode device illustrated in FIGURE 2*c* utilizes the feed-through arrangement of FIGURE 1 in a slightly different manner. As shown therein, the device consists of a block of semiconductive material 4 in which a hole is formed, such as by drilling. At the bottom of the hole, a P–N junction diode is formed by alloying, or otherwise bonding to the material 4, a dot of semiconductive material 8 of proper conductivity type. A lead wire 10 with a glass bead 6 attached thereto is inserted in the hole and electrically connected to the dot 8. The structure is then heated to fuse the glass bead to the rim of the hole and the diode is thus hermetically sealed therein.

Figure 3A:
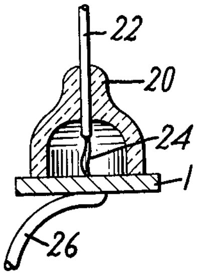
Figure 3B:
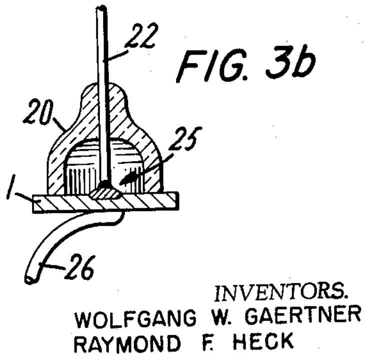

The diode illustrated in FIGURE 3*a* comprises a semiconductor wafer 1 having fused thereto a bell or cup-shaped glass dome 20. Through the dome 20 is inserted a lead wire 22, having a cat whisker 24 extending from the lower end thereof to contact the upper surface of the wafer. This forms one terminal of a point contact diode. The other terminal is formed by the ohmic connection of lead wire 26 to the under surface of the wafer. It will be appreciated that a structure of this type can be made extremely small in size, it being necessary only that the glass cup 20 be sufficiently large to encompass the contact area of the cat whisker. FIGURE 3*b* illustrates the same technique applied to a junction diode, in which a P–N junction 25 replaces the cat whisker of FIGURE 3*a*.

Figure 3C:
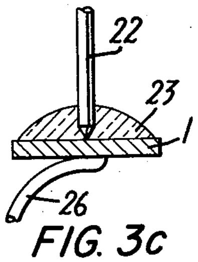

FIGURE 3*c* illustrates an alternate embodiment of the diode structure of FIGURES 3*a* and 3*b* wherein a solid lump of glass is used to form the hermetic seal. The point contact is established between the lead wire 22 and the wafer 1 and the entire contact area sealed in glass. This provides an extremely rugged and minute structure, and can obviously be applied to junction diodes, or multi-electrode devices such as transistors, as well. Devices of this type may be fabricated by inserting the conductive leads through the glass lump after it has been placed on the semiconductor wafer and heated to its softening point.

Figure 4A:
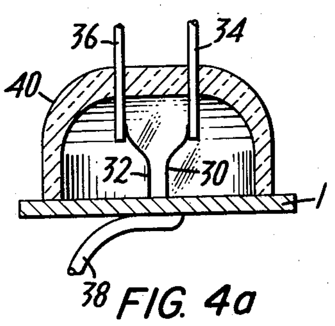
Figure 4B:
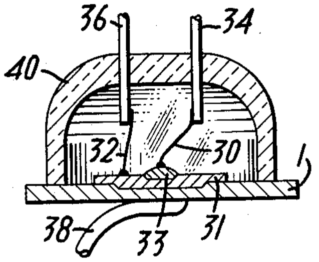

The transistors illustrated in FIGURES 4*a* and 4*b* utilize a solid semiconductive wafer 1, on one surface of which is arranged the active electrode structure of the device. In FIGURE 4*a* this is formed by leads 30 and 32 forming point contacts with the wafer, while 4*b* illustrates the junction modification having semiconductor zones 33 and 31 forming a junction transistor with the wafer 1. Enclosing the active area is a glass dome or cup 40 through which are inserted conductive leads 34 and 36. The latter are electrically connected to the leads 30 and 32, respectively. The glass cup 40 is fused and hermetically sealed to the upper surface of the wafer 1. The third lead for the device is provided by conductor 38, ohmically connected to the lower surface of the wafer. This encapsulation technique is, of course, applicable to other semiconductor electrode structures as diodes, tetrodes, etc.

Figure 5:
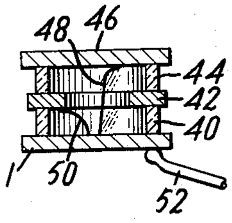

A structure utilizing the present invention and particularly adapted for computer applications is shown in FIGURE 5. The device comprises a wafer 1 of semiconductor material, a spacer in the form of a glass ring 40 mounted thereon, a metallic contact ring 42 mounted on top of the spacer 40, a second glass spacer 44 mounted on the contact ring, and finally a metal disc 46 on the spacer 44 and sealing the structure. A lead 50 has one end electrically connected to the ring 42 and forms a point contact with the upper surface of the semiconductor wafer at its other end. A similar lead 48 extends from the connecting disc 46 to form a second point contact with the wafer. The third lead is provided by conductor 52 ohmically connected to the under surface of the wafer 1. As will be apparent therefrom, the resultant structure is in the form of a button-like element, which is particularly adaptable for use in modern computer circuitry.

Many present and contemplated computer circuit organizations are formed on cards which consists of "sandwiches" of insulating mounting board and electrical components. Thus, the outer disc 46 of the device of FIGURE 5 may lie in a plane of the circuit board on which is deposited the collector circuitry for the transistors, the connecting ring 42 may lie in an interior plane of the board in which the emitter circuitry is deposited, and finally the wafer 1 may be in the same plane as the base circuitry of the devices. The transistor devices would then lie flush with the circuit card and enable a substantial decrease in overal space required by the computer circuitry.

Figure 6:
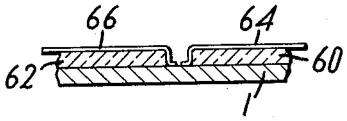

Another application of the glass-to-semiconductor seal of the present invention is illustrated in FIGURE 6. A layer of semiconductive material 1 may have deposited thereon and fused thereto one or more layers of glass 60, 62. The glass layers or films act as a support for microelectric resistors and capacitors, represented by strips 64, 66 which are formed by deposition on the semiconductor substrate block but which must be carefuly insulated from it. Gaps in the layers may be provided to effect the necessary connections to the semiconductor material, which may form part of or on which may be fabricated complete semiconductor devices. The film may be formed on the semiconductor block by various methods such as by grinding glass to a fine powder, applying a layer of the powder to the semiconductor substrate block, and then heating the substrate and powdered glass to form the fused bond. Alternatively, the semiconductor material may be heated to the proper temperature and a thin piece of glass touched to it and wiped across its surface to leave a smooth thin layer.

The film depositing technique is also applicable as a means of surface passivation prior to diffusion or epitaxial growth. When utilized for this purpose, the glass film is applied by proper masking to provide the desired pattern.

Figure 7:
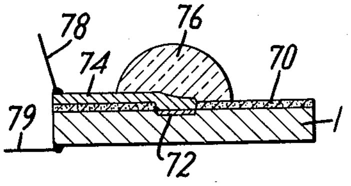

FIGURE 7 illustrates the utilization of the glass-to-semiconductor seal to simplify diode manufacture. The device illustrated therein comprises a semiconductor wafer 1 which is provided with a heavy oxide layer 70. A small circular hole in the oxide layer is etched out and a suitable impurity diffused through the hole to form a P–N junction 72. A layer of conducting metal 74 is subsequently evaporated over the oxide and into contact with the diode. Finally, a solid lump of glass 76 is fused over the entire active area of the structure to form the hermetic seal. Leads 78 and 79 are connected to the metallic layer 74 and the semiconductor wafer 1 respectively. Such a device requires no separate mounting structure at all and may be extremely small in size. Moreover, the manufacturing techniques involved are extremely simple and high volume production of high quality devices is possible.

Figure 8:
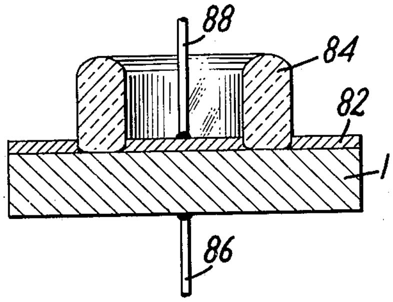

A diode manufactured in accordance with another technique utilizing a glass-to-semiconductor seal is shown in FIGURE 8. A glass ring 84 is initially fused onto the semiconductor wafer 1. The wafer with the glass ring attached is then put into a diffusion furnace and a shallow surface layer diffused thereon, having a peneration in the order of a few microns and less than the penetration of the glass ring. The diffusion process thereby produces a P–N junction within the glass ring which is already hermetically sealed. Instead of utilizing the diffusion process, the junction may be formed by growing an epitaxial layer on the surface of the semiconductor within the glass ring. The leads 86, 88 may then be affixed to the respective sides of the device. Alternatively, the device may be formed by initially diffusing or epitaxially forming the junction and then sealing the glass ring thereon to provide the hermetic seal.

It will be apparent from the foregoing, that many variations of semiconductor devices utilizing the glass-to-semiconductor seal of the present invention will occur to those skilled in the art, and the disclosed embodiments are merely exemplary of the many possible embodiments. It is to be understood that by the term glass used herein, is meant any substance exhibiting the characteristics of the vitreous condition, and may include ceramic materials as well as those commonly known as glass. Furthermore, semiconductor materials other than silicon and germanium may be employed, it being necessary only that they have a melting point above the softening point of the vitreous substance with which they are used. Accordingly, it is intended that the present invention be limited only by the scope of the appended claims.

We claim:

1. A semiconductor device comprising a wafer of semiconductive material, an active electrode structure disposed on one side of said wafer and at least in part in rectifying relationship therewith, a vitreous material hermetically enclosing said electrode structure and bonded to said wafer on said one side, at least one aperture formed in said wafer, a conductive lead extending from said electrode structure through said aperture, a vitreous material bonded to said conductive lead and said wafer and hermetically sealing said aperture, and an additional conductive lead electrically connected to the other side of said wafer, said other side being otherwise exposed to form an exterior surface of said device in completed form.

2. A semiconductor device according to claim 1 in which said active electrode structure provides a point contact with said one side of said wafer.

3. A semiconductor device according to claim 1 in which a junction of semiconductor materials of opposite conductivity types is formed between said active electrode structure and said one side of said wafer.

4. A method of fabricating a semiconductor device having a wafer of semiconductive material comprising the steps of, placing a vitreous material in contact only with one side of said wafer of semiconductive material, heating the materials to a temperature below the melting point of the semiconductive material but above the softening point of the vitreous material, inserting a conductive lead through said vitreous material while so heated, and cooling the materials to form fused bonds between said semiconductive and vitreous materials, and said vitreous material and conductive lead, respectively.

5. The method according to claim 4 wherein said lead is inserted through said vitreous material and into electrical contact with said one side of said wafer of semiconductive material.

References Cited by the Examiner

UNITED STATES PATENTS

| | | | |
|---|---|---|---|
| 2,773,224 | 12/1956 | Lehovec ------------ | 317—235 |
| 2,784,532 | 3/1957 | Griffiths -------------- | 65—59 |
| 2,807,558 | 9/1957 | Pankove ------------ | 317—234 |
| 2,998,558 | 8/1961 | Maiden et al. ------- | 317—234 |
| 3,022,452 | 2/1962 | Williams et al. ------ | 317—236 |

JOHN W. HUCKERT, *Primary Examiner.*

JAMES D. KALLAM, DAVID J. GALVIN, *Examiners.*